United States Patent [19]

El Gamal

[11] Patent Number: 5,341,041
[45] Date of Patent: Aug. 23, 1994

[54] BASIC CELL FOR BICMOS GATE ARRAY

[75] Inventor: Abbas El Gamal, Palo Alto, Calif.

[73] Assignee: SiArc, Sunnyvale, Calif.

[21] Appl. No.: 743,532

[22] Filed: Aug. 8, 1991

Related U.S. Application Data

[62] Division of Ser. No. 524,183, May 15, 1990, Pat. No. 5,055,716.

[51] Int. Cl.$^5$ ............................................ H03K 19/02
[52] U.S. Cl. .................................... 307/446; 307/443; 307/465; 307/466; 257/804
[58] Field of Search ............... 307/465, 468, 465.1, 307/466, 443, 446; 257/204, 206, 207, 209

[56] References Cited

U.S. PATENT DOCUMENTS

| | | | |
|---|---|---|---|
| 4,069,494 | 1/1978 | Grundy | 357/41 |
| 4,611,236 | 9/1986 | Sato | 357/456 |
| 4,649,294 | 3/1987 | McLaughlin | 307/446 |
| 4,682,202 | 7/1987 | Tanizawa | 357/45 |
| 4,727,266 | 2/1988 | Fujii et al. | 307/443 |
| 4,730,132 | 3/1988 | Watanabe et al. | 307/446 |
| 4,791,320 | 12/1988 | Kawata et al. | 307/446 |
| 4,804,868 | 2/1989 | Masuda et al. | 307/446 |
| 4,816,887 | 3/1989 | Sato | 357/42 |
| 4,829,200 | 5/1989 | Downey | 307/446 |
| 4,945,395 | 7/1990 | Suehiro | 357/40 |
| 4,965,651 | 10/1990 | Wagner | 357/42 |
| 5,021,690 | 6/1991 | Linz | 307/465 |
| 5,038,192 | 8/1991 | Bonneau et al. | 357/45 |
| 5,045,726 | 9/1991 | Leung | 307/466 |
| 5,047,669 | 9/1991 | Iwamura et al. | 307/446 |
| 5,055,716 | 10/1991 | El Gamel | 307/446 |
| 5,060,046 | 10/1991 | Shintani | 357/45 |
| 5,066,996 | 11/1991 | Hara et al. | 357/43 |
| 5,068,548 | 11/1991 | El Gamel | 307/446 |
| 5,072,285 | 12/1991 | Ueda et al. | 357/45 |
| 5,077,493 | 12/1991 | Misawa | 307/466 |

FOREIGN PATENT DOCUMENTS

| | | |
|---|---|---|
| 0336741 | 4/1988 | European Pat. Off. . |
| 290672B1 | 11/1988 | European Pat. Off. . |
| 57-148363 | 9/1982 | Japan . |
| 58-51536 | 3/1983 | Japan . |
| 58-122771 | 7/1983 | Japan . |
| 4-79143 | 1/1984 | Japan . |
| 578190 | 10/1984 | Japan . |
| 60-17932 | 1/1985 | Japan . |
| 4-79145 | 4/1985 | Japan . |
| 63-306641 | 12/1988 | Japan . |
| 2-284468 | 11/1990 | Japan . |

OTHER PUBLICATIONS

Sporck et al., "A CMOS Master Slice Chip With Versatile Design Features," 1984 IEEE.
Battista et al., "Multiple Function (I/O) Cell Layout," IBM Technical Disclosure Bulletin, vol. 22, No. 7, Dec. 1979.
*IBM Technical Disclosure Bulletin,* vol. 28, No. 8, issued Jan. 1986 (Armonk, N.Y.), "Merged Bipolar–CMOS Device", see FIG. 1.

*Primary Examiner*—Robert J. Pascal
*Assistant Examiner*—R. A. Ratliff
*Attorney, Agent, or Firm*—Skjerven, Morrill, MacPherson, Franklin & Friel

[57] ABSTRACT

An improved cell for use in a mask programmable gate array is disclosed herein. The preferred cell comprises two compute sections, each comprising two pairs of medium size P and N-channel transistors, two small N-channel transistors, and a single small P-channel transistor. Each cell also comprises a high efficiency drive section containing a single bipolar pull-up transistor, a large N-channel pull-down transistor, and a small P-channel transistor. By using this cell, an extremely high compute capability per die area is achieved.

42 Claims, 14 Drawing Sheets

22, 24 COMPUTE SECTIONS | 26 DRIVE SECTION

26 | 22, 24

22, 24 | 26

26 | 22, 24

BASIC CELL FOR BICMOS GATE ARRAY

This application is a division of application Ser. No. 07/524,183, filed May 15, 1990, U.S. Pat. No. 5,055,716.

CROSS REFERENCE TO RELATED APPLICATIONS

This application relates to U.S. Pat. No. 5,068,548, entitled "BiCMOS Logic Circuit For ASIC Applications" by Abbas El Gamal, incorporated herein by reference.

FIELD OF THE INVENTION

This invention relates to integrated circuits and in particular to Application Specific Integrated Circuits, which include programmable gate arrays.

BACKGROUND OF THE INVENTION

Programmable gate arrays, sometimes containing over one million transistors, are frequently used to create economical Application Specific Integrated Circuits (ASIC). A programmable gate array may be metal mask programmable, electrically programmable, or laser programmable. In a mask programmable gate array, the silicon die containing the unconnected transistors is called a master slice or master image. A user who wishes to customize a master slice uses well-known software programs and predefined logic circuit configurations (macrocells) contained in a macrocell library to selectively interconnect the transistors within the gate array to provide an ASIC.

In one type of metal mask programmable gate array, an array of cells is formed on a chip wherein each cell is comprised of a plurality of unconnected components. In a typical arrangement, there is a variety of types of components in each cell to enable a designer of the macrocells to create various kinds of logic circuits within each cell or by using a combination of cells. Ideally, each cell should contain an optimum number and variety of components so that the designer may create a wide variety of macrocells using the shortest interconnect wire lengths, using a minimum amount of die area, and using other techniques for achieving high performance for each macrocell.

In a programmable gate array structure, CMOS transistors frequently comprise the components of a cell due to the low power consumption of a CMOS device, where an N-channel and a P-channel MOSFET are connected in series between a power supply terminal and ground. Because the gates of these CMOS transistors are made common, one transistor will be off while the other transistor will be on, thus avoiding a low impedance path between the power supply terminal and ground. These CMOS transistors may be used as building blocks to create a wide variety of macrocells.

Since die area is limited, it is desirable to make the CMOS transistors small, resulting in the CMOS transistors typically having only moderate current handling capability. To overcome any excessive parasitic capacitance, inductance, and resistance of conductors and components connecting the output of the CMOS transistors to one or more subsequent stages, either a plurality of CMOS transistors must be connected in parallel to source or sink a large output current or, alternatively, high current drivers may be incorporated in the integrated circuit. Drivers may be located within each cell to amplify the low current output of the CMOS transistors within the cell or may be located only in selected areas of the chip.

One type of semiconductor technology which has become increasingly popular due to its fast switching speed and high output drive current is referred to as BiCMOS technology. In a BiCMOS circuit, bipolar transistors may be used as the drivers, since their switching speed can be significantly faster than MOSFETs of the same size.

In one prior art cell of a BiCMOS gate array, a plurality of CMOS transistors are contained within each cell along with two bipolar devices for use as the driver. A prior art cell containing these two bipolar transistors is described in the article entitled, "A High Density BiCMOS Direct Drive Array," by Wong et al., IEEE, 1988 CICC. This article describes an improvement over previous BiCMOS gate arrays which generally include the bipolar driver stage in each of the cells. Since, according to the article, a driver is not needed for every macrocell, cells containing the bipolar driver transistors are only located around the periphery of an internal core of CMOS logic gates. In this prior art device, each BiCMOS block consists of two CMOS logic gates, four additional N-channel MOSFETs, and two NPN bipolar transistors. The BiCMOS blocks described in this prior art article are used to build high speed and high drive circuits. However, if an internal pure CMOS cell requires a peripheral bipolar transistor driver, long interconnect lines are needed, which incur delay.

Thus, as evidenced by the above-mentioned article and its improvement over the prior art, prior art BiCMOS programmable gate array designs have included either a majority of BiCMOS cells (each having two bipolar transistors) or only a limited number of BiCMOS cells arranged along the periphery of the chip.

CMOS components contained in these prior art BiCMOS and standard CMOS cells are made fairly large to drive typical loads of, for example, 0.4 pF without the use of the bipolar driver. Also, a conventional BiCMOS circuit, when using two bipolar transistors for a driver, requires a number of MOSFETs to buffer the base of the pull-down NPN bipolar transistor to prevent a high voltage (e.g., 5 volts) input signal from being directly applied to the base of the NPN pull-down transistor to avoid drawing a high base current. Thus, in these prior art BiCMOS cells and standard CMOS cells, due to a cells' requirement to adequately drive one or more subsequent stages, the compute capability of a cell per die area is relatively low. Hence, BiCMOS and CMOS programmable gate arrays make relatively inefficient use of die area.

Additionally, since the bipolar transistor driver is not ultimately connected in most macrocells actually used in an ASIC because their drive power is not required to drive one or more subsequent stages, the relatively large amount of die area dedicated to the bipolar transistor drivers is wasted. Further, it is not desireable to use drivers when driving a low to moderate capacitance load, since the CMOS transistors can, by themselves, adequately drive these loads, and the drivers would thus incur an unnecessary switching delay.

It is also common practice to include BiCMOS cells as input/output (I/O) drivers, where each BiCMOS I/O cell is associated with a pin of the chip; however these BiCMOS cells are not typically used for internal driving requirements.

Accordingly, what is needed in the field of programmable gate arrays is a cell which achieves the same or higher performance as existing BiCMOS gate arrays as well as achieves a higher compute capability per die area than CMOS and BiCMOS gate arrays.

SUMMARY OF THE INVENTION

A highly efficient cell structure for use in a metal mask programmable gate array, such as a sea of gates type gate array, is disclosed herein. In a basic cell, in accordance with one embodiment of the invention, a first compute section of the cell comprises two medium size P-channel transistors having one current handling terminal made common through a common diffused region; a small size P-channel transistor having a current handling terminal coupled to the common nodes of the medium size P-channel transistors for acting as a pull-up transistor; two medium size N-channel transistors having one current handling terminal made common through a common diffused region; and two small N-channel transistors having one current handling terminal made common through a common diffused region. This first compute section is duplicated in a second compute section within the cell. Additional compute sections for the cell may be added in alternative embodiments.

A drive section is incorporated in each cell, which includes an NPN bipolar transistor for acting as a fast pull-up device, a large N-channel transistor for acting as a fast pull-down device, and a small P-channel transistor for pulling up the output of the driver to the power supply voltage.

In this preferred basic cell, only a single bipolar transistor is incorporated in each cell as a pull-up device. If the NPN bipolar transistor is connected such that its collector is coupled to a power supply terminal, its emitter connected to the drain of the large N-channel transistor, and the source of the N-channel transistor connected to ground, this NPN bipolar transistor and N-channel transistor can be used as a driver for each cell.

Since, in the preferred embodiment, many macrocells formed using the above-described cell include the bipolar/NMOS transistor driver, the CMOS transistors within the compute sections of each cell may be made much smaller than the CMOS transistors in the prior art cells, since these relatively large CMOS transistors in the prior art cells are intended to drive low to medium capacitance loads directly without a driver.

As will be described in more detail below, the particular components within the preferred cell and their arrangement within the cell have been selected to provide an improved cell for use in a mask programmable gate array structure which is more efficient than any prior art cell known to date.

BRIEF DESCRIPTION OF THE DRAWINGS

FIGS. 3–14, 9A and 9B show various logic circuits or macrocells which may be implemented with the cell structure shown in FIGS. 1 and 2;

DETAILED DESCRIPTION OF THE PREFERRED EMBODIMENT

Figure 1:
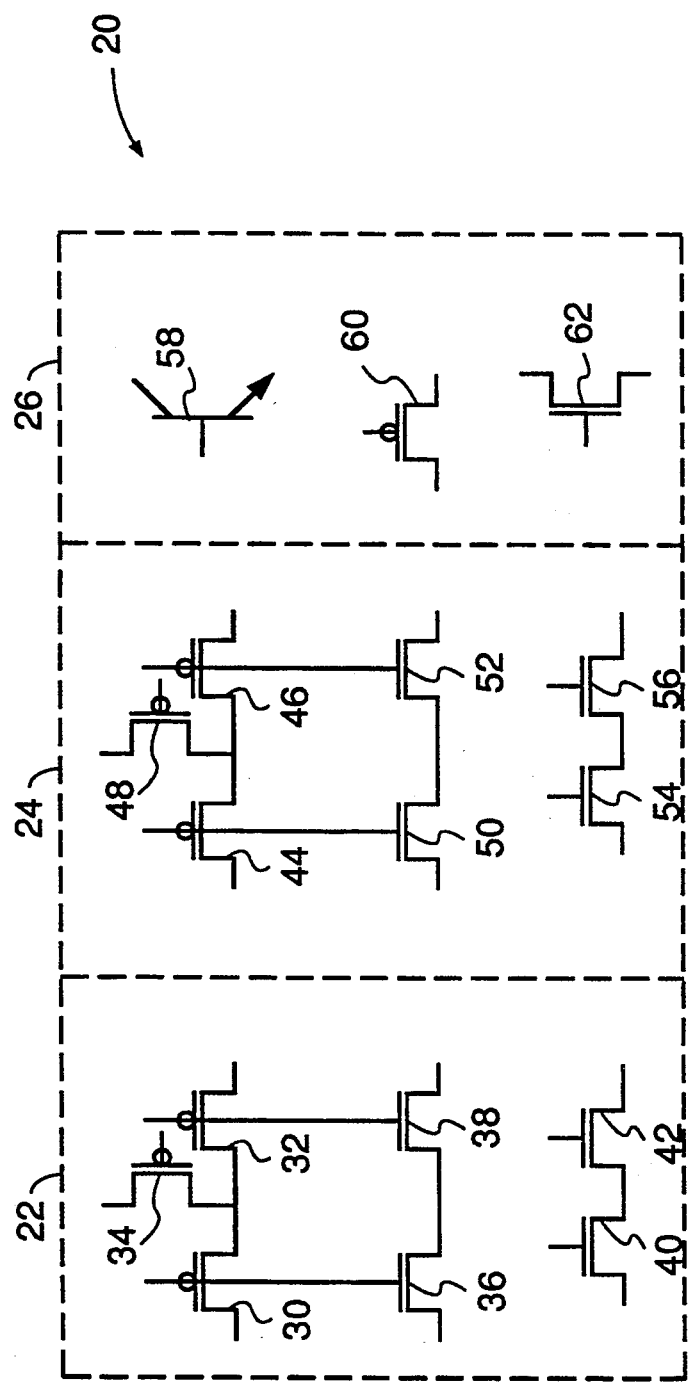
FIG. 1 shows a basic cell schematic for a preferred embodiment cell in a mask programmable sea of gates structure.

FIG. 1 is a schematic diagram of a preferred embodiment cell for use in a metal mask programmable gate array, such as a sea of gates type gate array. One major advantage of the cell shown in FIG. 1 is its capability of forming two static RAM (SRAM) memory cells using only the components within the single cell. This enables a programmable gate array incorporating the cell of FIG. 1 to be easily configured as a static memory array. Other logic circuits which may be formed with the cell of FIG. 1 will be described with respect to FIGS. 3–14.

Cell 20 in FIG. 1 generally comprises three sections. Compute sections 22 and 24 are identical, which facilitate the creation of master/slave type flip-flops and other sequential or symmetrical type logic circuits. Drive section 26 is generally used to form a high current source/sink driver for the low current output of the compute section to drive a vast majority of load requirements. Specific interconnections of sections 22 and 24 and drive section 26 to form a variety of macrocells will be discussed with respect to FIGS. 3–14.

In compute section 22, two medium size P-channel transistors 30 and 32, having nominal channel widths of 6.8 microns and nominal channel lengths of 0.8 microns, are formed to have a common current handling terminal by sharing a P dopant diffusion region. Small P-channel transistor 34, having a nominal channel width of 2.4 microns and a nominal channel length of 0.8 microns, shares a common node with transistors 30 and 32 by sharing the P dopant diffusion region previously mentioned.

Also formed in compute section 22 are medium size N-channel transistors 36 and 38, each having a nominal channel width of 6.8 microns and a nominal channel length of 0.8 microns. One terminal of transistors 36 and 38 is made common by their sharing of an N dopant diffusion region. In a preferred embodiment, shown in FIG. 1, the gate of P-channel transistor 30 and the gate of N-channel transistor 36 are made common, and the gate of P-channel transistor 32 and the gate of N-channel 38 are made common.

Small N-channel transistors 40 and 42 are also contained in compute section 22 and have nominal channel widths of 3.4 microns and nominal channel lengths of 0.8 microns. Transistors 40 and 42 are formed to have a common terminal by sharing an N dopant diffusion region.

Compute section 24 is identical to section 22. Compute section 24 contains medium size P-channel transistors 44 and 46, small size P-channel transistor 48, medium size N-channel transistors 50 and 52, and small size N-channel transistors 54 and 56.

Drive section 26 comprises NPN bipolar transistor 58, small P-channel transistor 60, and large N-channel transistor 62. P-channel transistor 60 has a nominal channel width of 2.0 microns and a nominal channel length of 0.8 microns. Large N-channel transistor 62, for use as a pull-down transistor, has a nominal channel width of 16.0 microns and a nominal channel length of 0.8 microns. Bipolar transistor 58 is intended for use as a pull-up device, while small P-channel transistor 60 is intended to be connected in parallel with the base/emitter of transistor 58 to eliminate any threshold voltage drop between the input of the driver and the output of the driver. Thus, after bipolar pull-up transistor 58 has applied the necessary current to charge one or more subsequent stages coupled to the output of drive section 26, small P-channel transistor 60 will then act to raise the voltage at the emitter of transistor 58 and supply any necessary transient current to the subsequent stages coupled to the emitter of transistor 58.

Although, as shown in FIG. 1, P-channel transistors 32 and 44 are insulated from one another, these transistors may be electrically connected by placing an additional P-channel transistor in series between transistors 32 and 44. By applying an appropriate gate voltage to this additional transistor, transistors 32 and 44 may be made electrically connected or not electrically connected. Similarly, an additional N-channel transistor may be placed in series between N-channel transistors 38 and 50 and controlled to either electrically connect or disconnect transistors 38 and 50.

Absolute sizes of the transistors given above are not critical to the invention. The sizes given above of the small P and N-channel transistors have been chosen such that the transistors' source and drain regions are just large enough to accommodate a metal contact. The size of the medium N-channel transistors has been chosen to be approximately twice the size (i.e., channel width) of the small N-channel transistors so as to have approximately twice the current handling capability. The size of the medium P-channel transistors has been chosen as large as possible; however, its size must be such that the current drive capability of the small N-channel transistors is greater than the current drive capability of the medium P-channel transistors. (The reasons for these preferred relative proportions will become apparent upon an understanding of the SRAM cell of FIG. 7.) The size of the large N-channel pull-down transistor is made as large as possible given the remaining cell area.

The typical connection and operation of driver transistors 58 and 62 in a macrocell are as follows. In one embodiment of this inventive driver, a first input signal is applied to the base of NPN bipolar transistor 58, whose collector is typically coupled to a positive power supply voltage. A second input signal of a polarity opposite that of the first input signal is coupled to the gate of large N-channel transistor 62, having its drain coupled to the emitter of bipolar transistor 58 and its source coupled to ground. The common node of bipolar transistor 58 and N-channel transistor 62 provides the output signal of the driver. Hence, bipolar transistor 58 and N-channel transistor 62 are normally configured to assume opposite states to provide a high or low output signal with very low leakage current passing from the power supply terminal to ground through bipolar transistor 58 and N-channel transistor 62.

This driver is inherently smaller than prior art BiCMOS drivers since the driver requires fewer transistors to operate, and its performance is comparable to standard BiCMOS drivers. Additional advantages of this novel driver circuit are discussed in the patent application entitled, "BiCMOS Digital Driver Circuit," by the present Applicant, filed herewith and incorporated herein by reference. A cell using this type driver will be termed herein as a BiNMOS cell.

Figure 2:
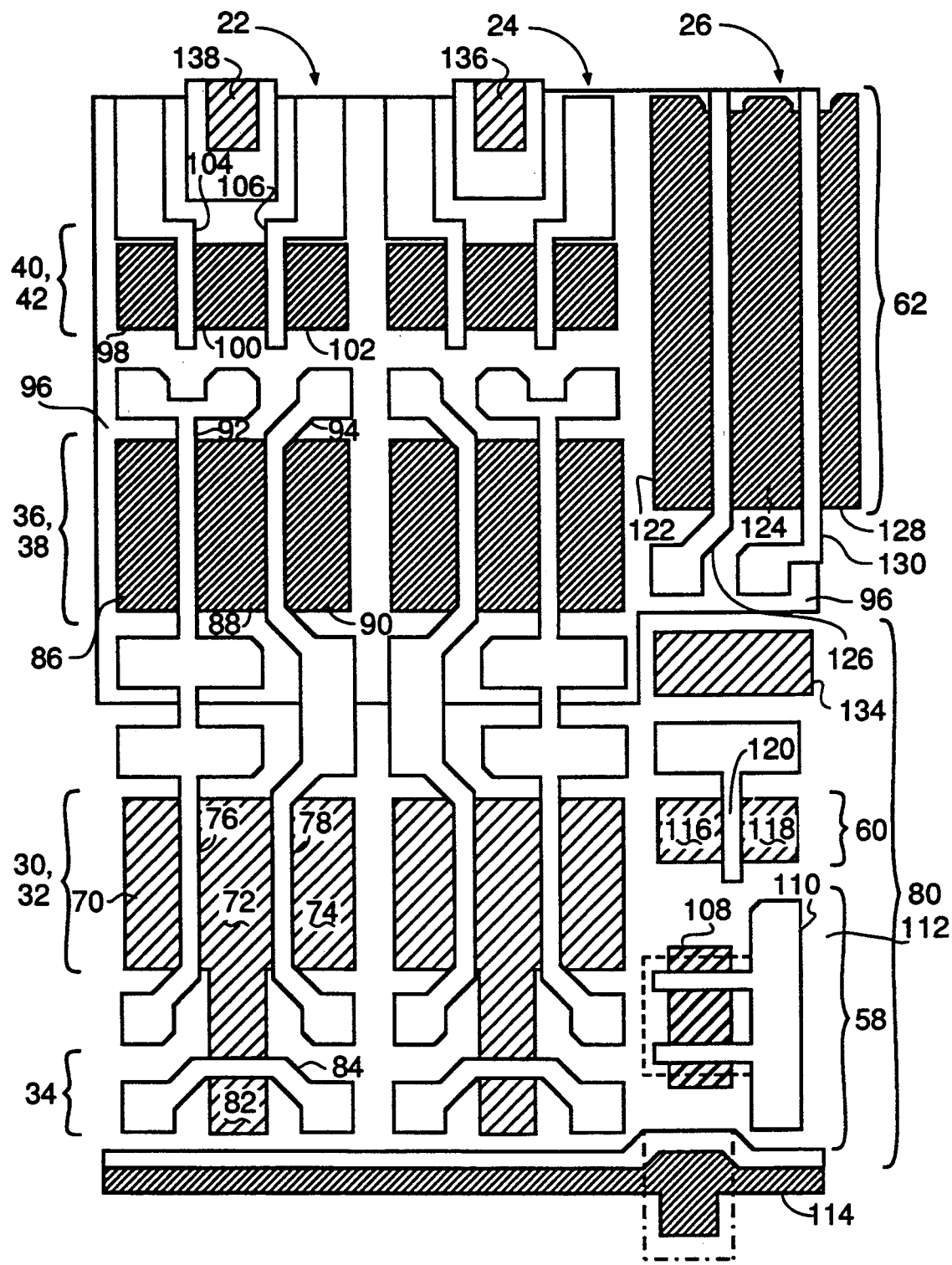
FIG. 2 shows a preferred layout for the basic cell structure illustrated in FIG. 1.

FIG. 2 shows a preferred embodiment of the layout of the cell of FIG. 1, where polysilicon gates are shown with solid lines, N dopant diffused regions are shown with narrow hatch lines, and P dopant diffusion regions are shown with more widely spaced hatch lines. In FIG. 2, compute sections 22 and 24 and drive section 26 are arranged vertically. Compute sections 22 and 24 are identical.

P-channel transistors 30 and 32, identified in FIG. 1, are generally identified in FIG. 2 within compute section 22. P-channel transistors 30 and 32 are comprised of P dopant diffusion regions 70, 72, and 74, wherein polysilicon gates 76 and 78 overlay and are insulated from channel regions within the lightly doped N-type well generally indicated as extending throughout area 80.

Small P-channel transistor 34, identified in FIG. 1, is shown in FIG. 2 as comprising P dopant diffusion 72, P dopant diffusion 82, and gate 84. The channel of transistor 34 is formed by the portion of the lightly doped N-well 80 underlying gate 84.

Medium size N-channel transistors 36 and 38, identified in FIG. 1, are shown in FIG. 2 as being formed by highly doped N regions 86, 88, and 90, with gates 92 and 94 overlaying a lightly doped P-type well region 96.

Small size N-channel transistors 40 and 42, identified in FIG. 1, are formed in FIG. 2 by highly doped N dopant diffusion regions 98, 100 and 102, with gates 104 and 106 overlaying and insulated from the lightly doped P-well 96.

The various components in compute section identified in FIG. 1, are laid out in FIG. 2 in a manner identical to the layout of the various components described with respect to compute section 22.

NPN bipolar transistor 58, identified in FIG. 1, is shown in FIG. 2 as comprising base region 108 formed by a continuous P dopant diffusion region, with polysilicon emitter contact 110 contacting N-type diffusion emitter regions (not shown) formed within P-type base region 108. Base region 108 is formed within collector 112, which comprises lightly doped N-well region 80. Emitter contact 110 and the emitter regions (not shown) are formed in parallel to increase the current handling capacity of NPN bipolar transistor 58.

Since NPN bipolar transistor 58 is intended to be used only as a pull-up device, bipolar transistor 58 is included in the same N-well 80 as all the P-channel transistors in the cell to conserve die area. Although in the preferred embodiment, the bipolar transistor is shown to be sharing an N-well with the P-channel transistors, the bipolar transistor may be located in a separate N-well, if desired, so that it may be used as a pull-down transistor for pulling down very high capacitance loads (e.g., greater than 2 pf) or used for any other requirements.

Highly doped N diffusion region 114 acts as the contact region for N-well 80.

Small size P-channel transistor 60, identified in FIG. 1, is shown in FIG. 2 as comprising P dopant diffused regions 116 and 118 with gate 120 overlaying and insulated from the channel region of transistor 60.

Large N-channel transistor 62, identified in FIG. 1, is shown in FIG. 2 as comprising highly doped N dopant diffusion regions 122 and 124, where gate 126 overlays and is insulated from the channel region.

To increase the potential pull-down capability of the BiNMOS cell of FIG. 2, gate 13.0 is formed in the cell overlaying a channel region between diffusion regions 124 and 128, where N dopant diffusion region 128 is a portion of a contiguous cell. Hence, three large N-channel transistors are actually formed within two contiguous cells. Thus, a large additional N-channel transistor is made available to be configured in parallel with any other pull-down N-channel transistor to increase the pull-down capability of the driver or, alternatively, this additional N-channel transistor may be configured in series with another large N-channel transistor, if desired.

Highly doped P diffusion regions 134, 136, 138 provide contact regions for P-wells within sections 26, 24, and 22, respectively.

The physical area of the cell shown in FIG. 2 is approximately 1300 square microns.

Dopant concentrations and other parameters of the cell of FIG. 2 are dependent on the specific requirements of the cell and may be determined by one of ordinary skill in the art.

FIGS. 3–13 provide a few examples of the various logic circuits or macrocells which may be formed using the single cell of FIGS. 1 and 2. In some cases (e.g., FIG. 13) the macrocell is formed using only a single compute section and the drive section. FIG. 14 is an example of a macrocell which may be formed using two cells.

The schematic diagrams of FIGS. 3–14 will be readily understood by one of ordinary skill in the art, and the operation of these various logic circuits will also be well known to one of ordinary skill in the art after reviewing the schematics.

The symbol size of the various components in the schematic diagrams of FIGS. 3–14 identify which of the components shown in FIG. 1 are being used, where small P-channel transistors 34, 48 and 60, shown in FIG. 1, are represented in FIGS. 3–14 as being smaller than the other transistors. Similarly, small N-channel transistors 40, 42, 54, and 56 are represented as being the smallest N-channel transistors. Medium size P and N-channel transistors 30, 32, 36, 38, 44, 46, 50, and 52 are shown being slightly larger than small size transistors but smaller than large N-channel transistor 62,-Inverters shown with an inverter symbol in FIGS. 3–14 are generally formed by medium size P-channel and N-channel transistors having common gates and connected in series between a power supply terminal and a ground terminal as a standard CMOS inverter.

In FIGS. 3–14, input signals are identified with the letters a and b, while outputs are generally identified by the letter z. More specific identifications of input signals and output signals needed for a better understanding of a particular circuit are labeled on the schematic diagrams.

Figure 3:
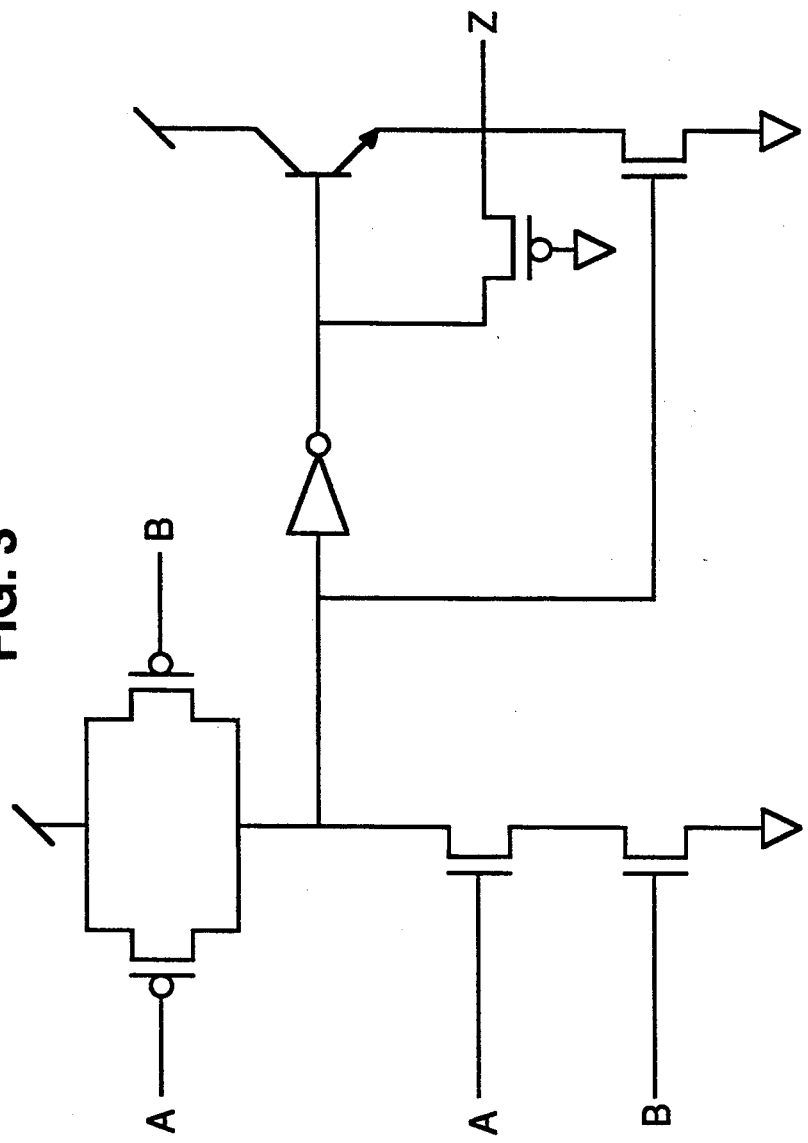

Specifically, FIG. 3 shows a two-input AND gate, where, if inputs a and b are high, output signal z will also be high.

Figure 4:
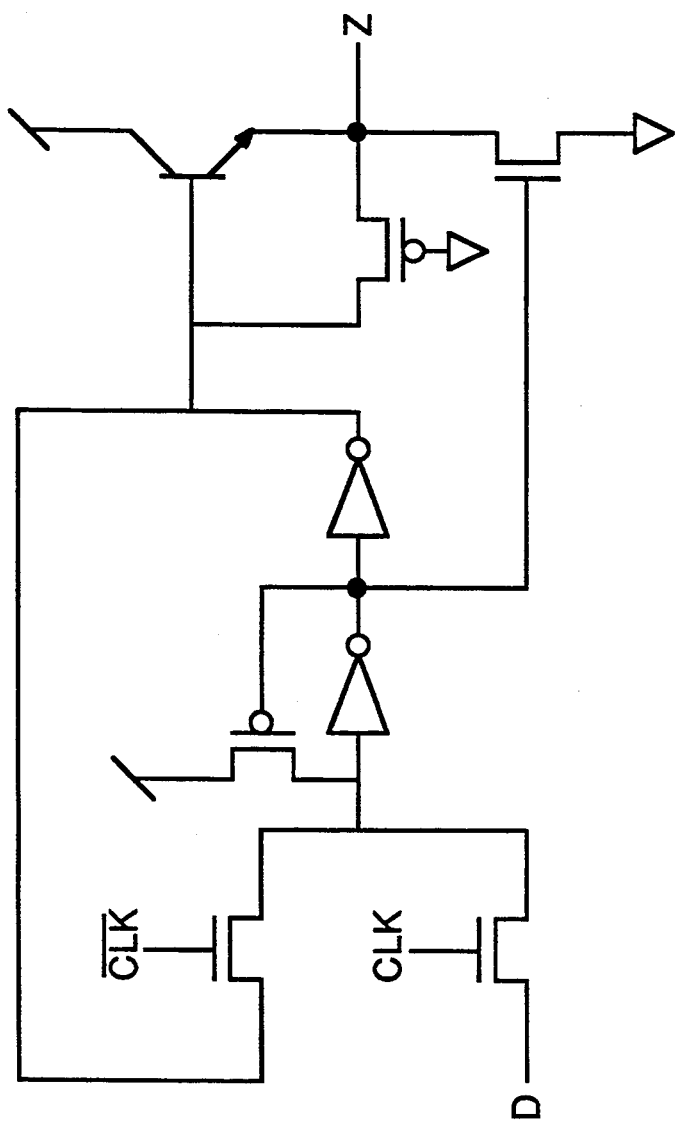

FIG. 4 shows a clocked latch wherein a high input signal D will be reflected as a high output signal z upon the occurrence of a high Clk signal. The output signal z becomes latched at the input signal level due to a feedback path created upon the occurrence of a high $\overline{Clk}$ signal (complement of signal Clk).

Figure 5:
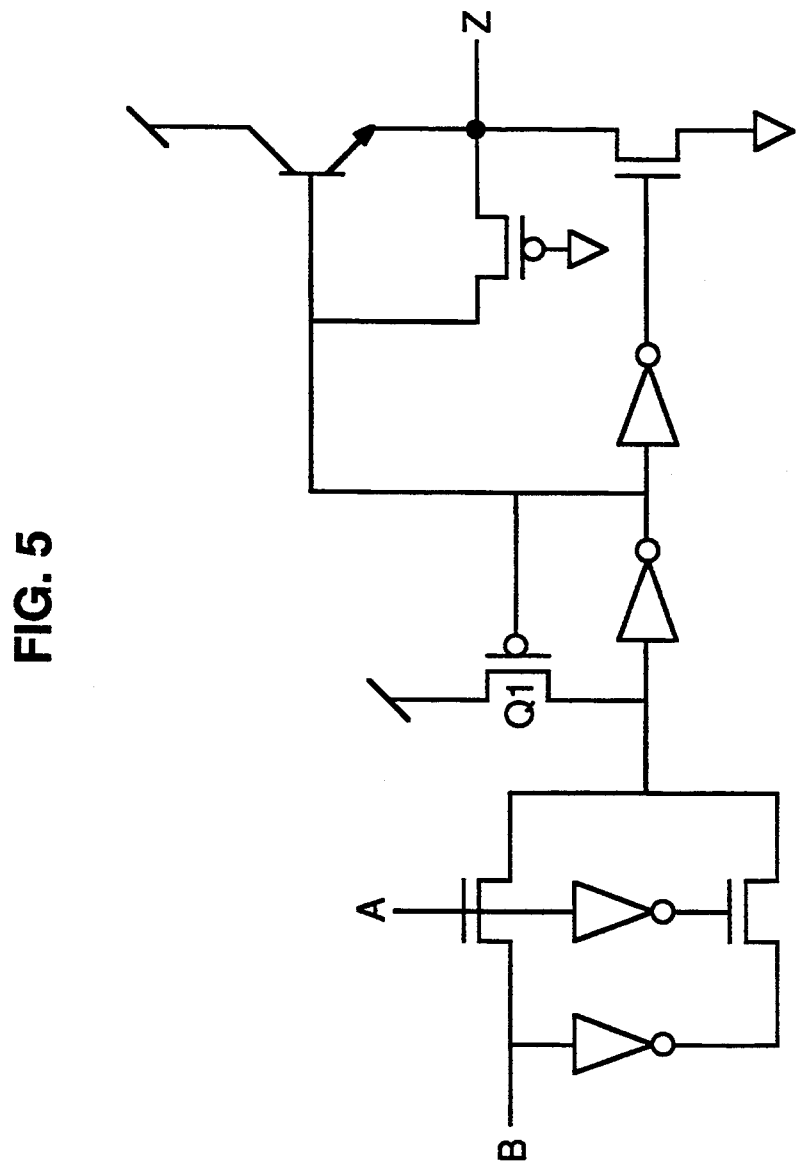

FIG. 5 shows a two-input exclusive OR gate having inputs a and b and output z, which, like the logic circuits of FIGS. 3 and 4, is formed using only the components within the cell shown in FIGS. 1 and 2.

Figure 6:
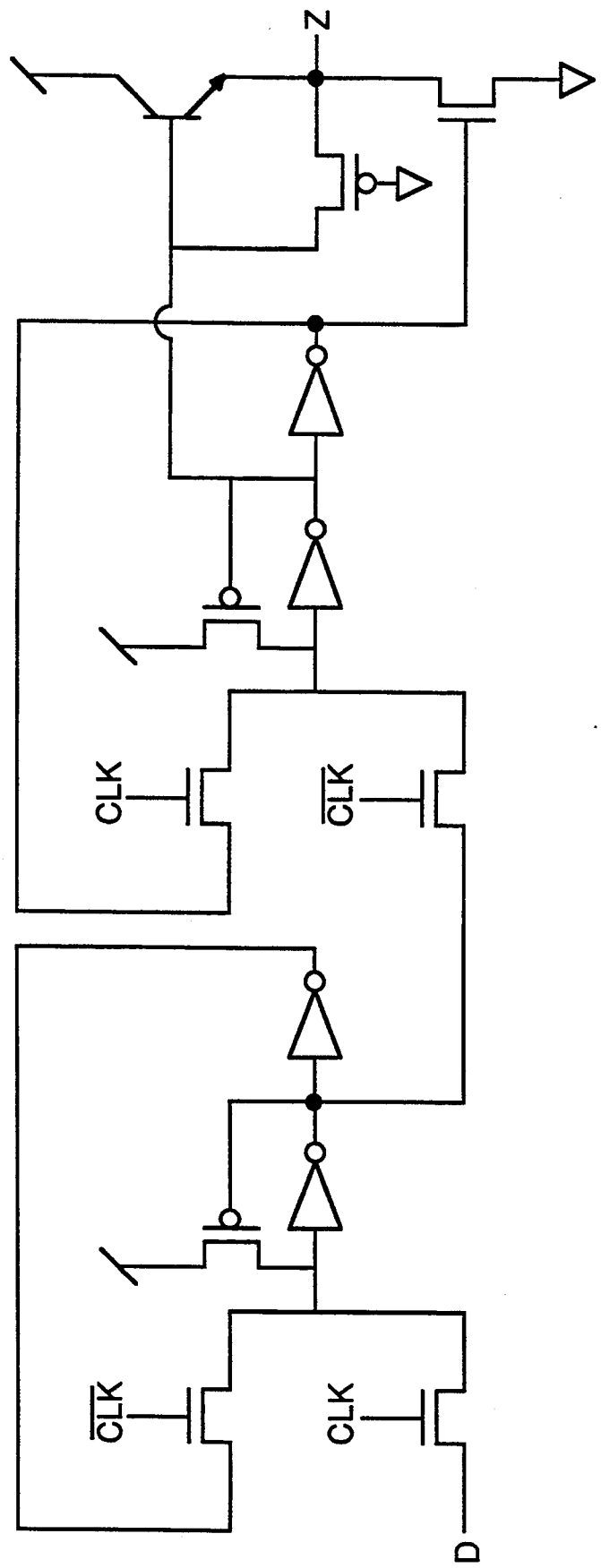

FIG. 6 is a master/slave type D flip-flop, which uses all the components in a single cell, having input D.

Figure 7:
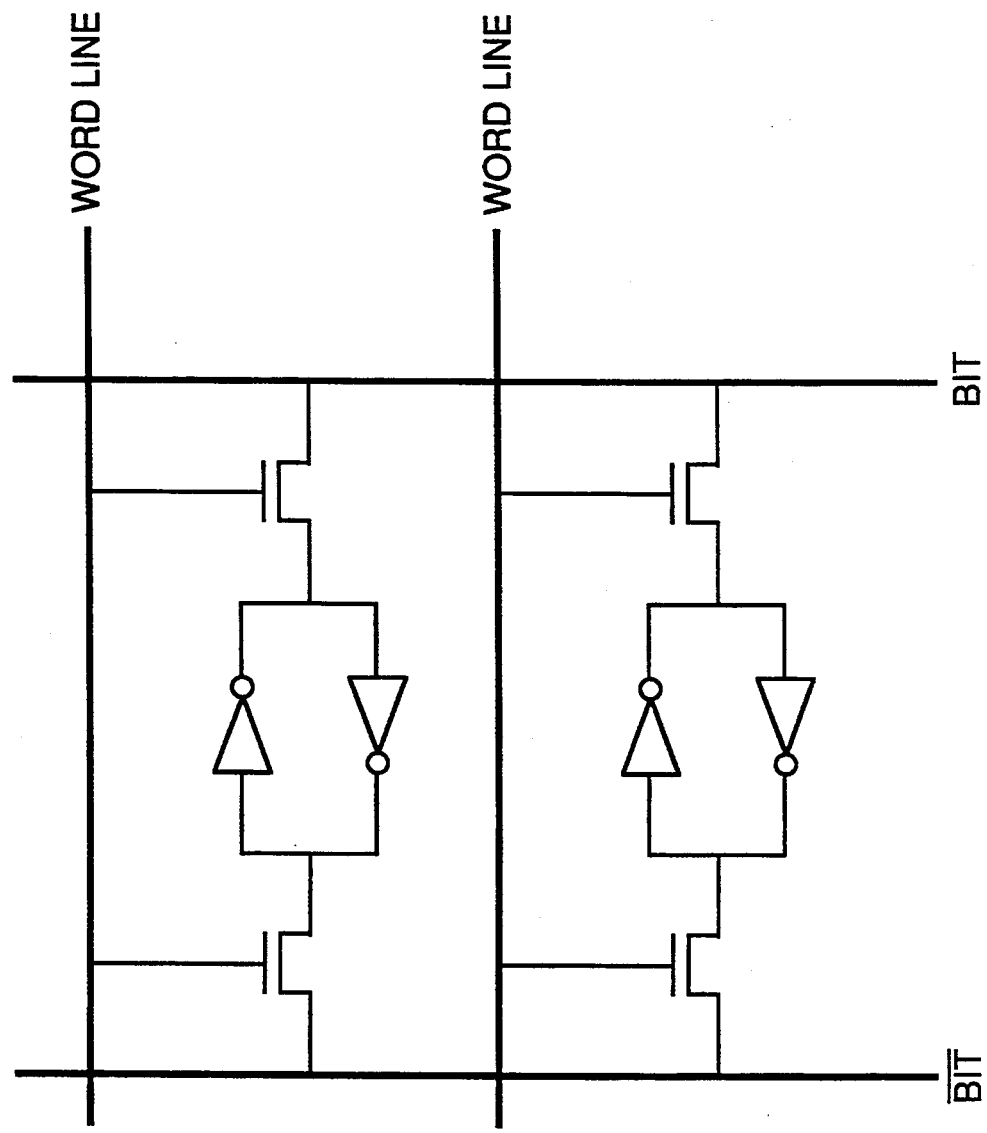

FIG. 7 shows two static RAM (SRAM) memory cells, each comprised of six transistors, which may be formed using only the single cell of FIGS. 1 and 2. These SRAM memory cells do not use the driver portion of the cell of FIGS. 1 and 2, since the state each SRAM memory cell is determined by a highly sensitive differential sense amplifier circuit coupled to the bit lines of the SRAM. This sense amplifier may easily be formed using other cells. Importantly, in the SRAM memory cells of FIG. 7, the small N-channel access transistors controlled by the word lines have a higher current drive capability than the current drive capability of the medium size P-channel transistors used in the CMOS inverters. This is necessary to ensure a reliable writing operation of the SRAM cell.

Figure 8:
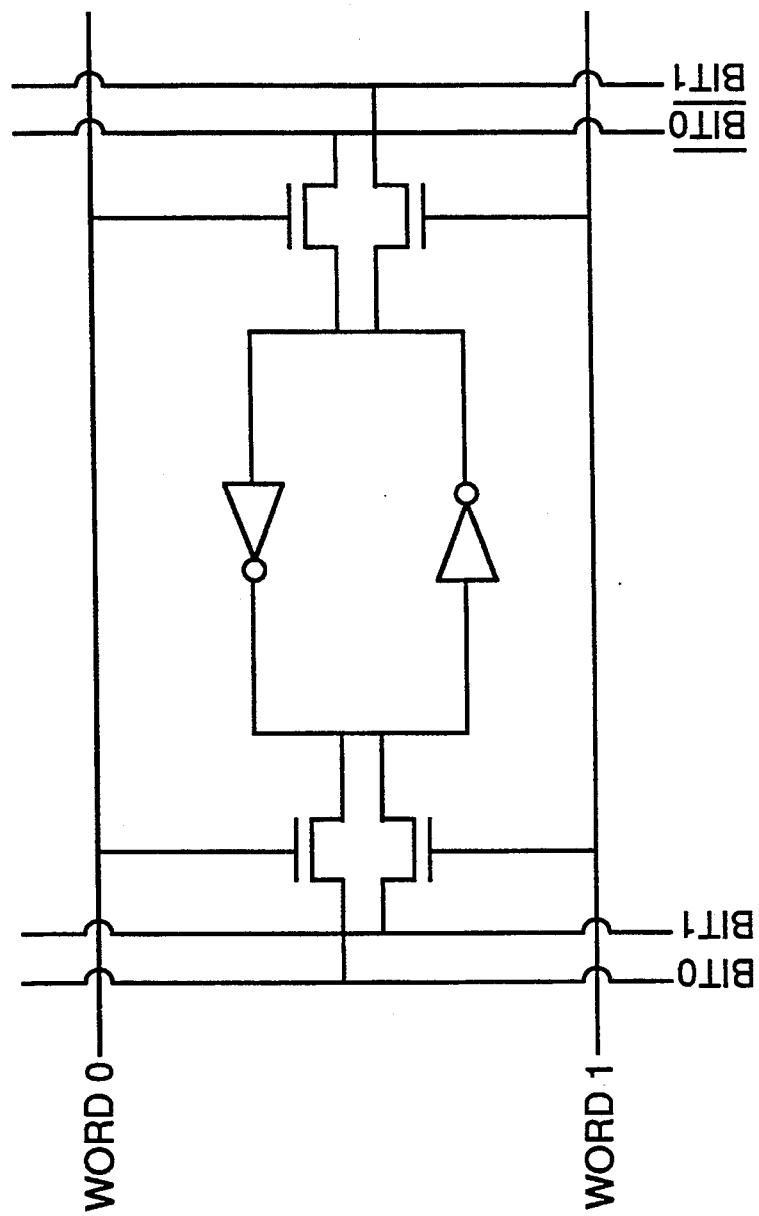

FIG. 8 shows a dual port SRAM which may be formed using only the components within the cell shown in FIGS. 1 and 2. In FIG. 8, the access transistors are small N-channel transistors, and the inverters are comprised of parallel medium size N and single P-channel transistors to ensure reliable simultaneous reading from both ports.

Figure 9A:
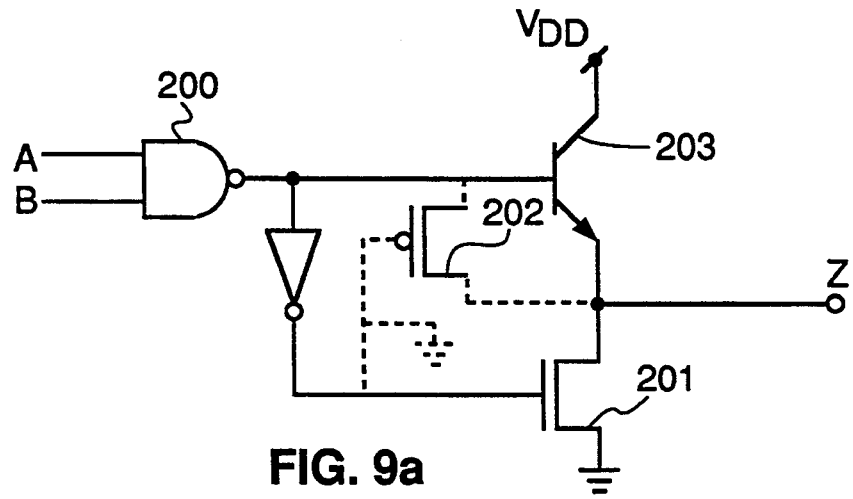
Figure 9B:
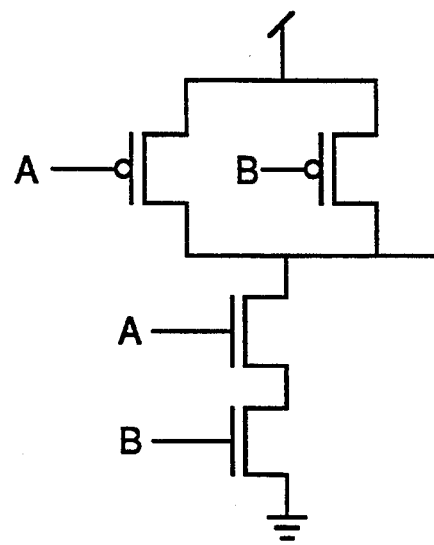

FIG. 9a is a NAND gate, formed from components within a single cell, which is advantageous for outputs having a relatively high parasitic capacitance. The inverter shown in FIG. 9a may be formed with medium size N and P-channel transistors, while NAND gate 200 may be formed using the circuit shown in FIG. 9b using small size N-channel transistors and medium size P-channel transistors. Large N-channel transistor 201 is used as the pull-down device. Optional small P-channel transistor 202 is connected between the base and emitter of bipolar transistor 203, with the gate of P-channel transistor 202 connected to either the gate of transistor 201 or to ground potential. P-channel transistor 202 eliminates the $V_{BE}$ drop across transistor 203 when output z is high.

Figure 10:
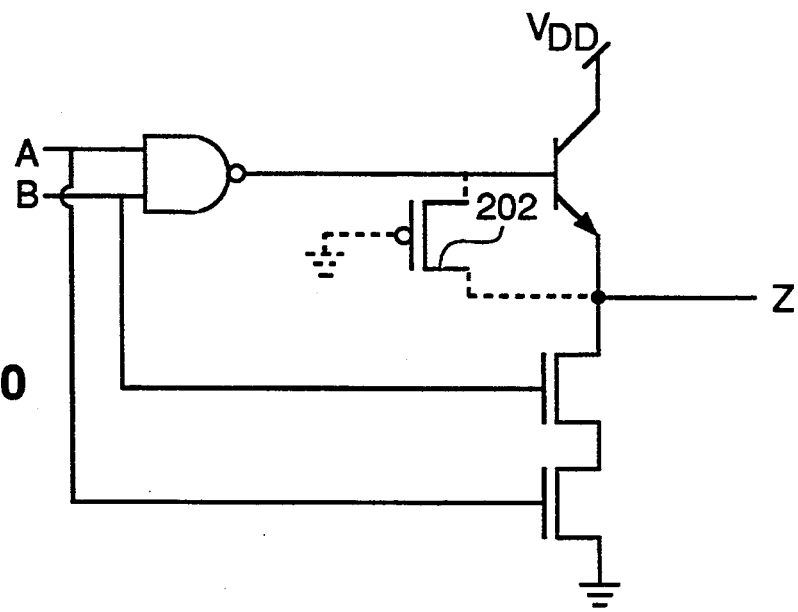

FIG. 10 is a NAND gate, formed from components within a single cell, which is advantageous for driving medium capacitive outputs, where the switching delay of the NAND gate is avoided in pulling down output signal z. Note that two N-channel pull-down transistors are used. These may be two large N-channel transistors made available in the cell layout of FIG. 2 using diffused regions 122, 124, and 128. Optional small P-channel transistor 202 is connected as in FIG. 9a with the gate of transistor 202 being connected to ground potential.

Figure 11:
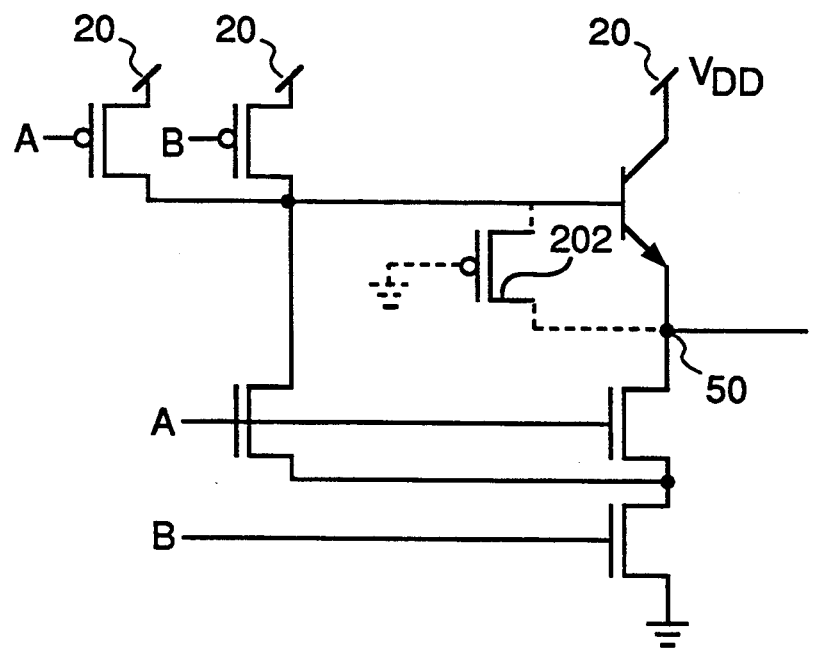

FIG. 11 is a NAND gate, formed using only a single cell, which uses very few transistors. Therefore, other components within the cell are made available for other circuits. The NAND gate of FIG. 11, however, is to be used only for driving a low capacitive load. Optional small P-channel transistor 202 is connected as in FIG. 9a with the gate of transistor 202 being connected to ground potential.

Figure 12:
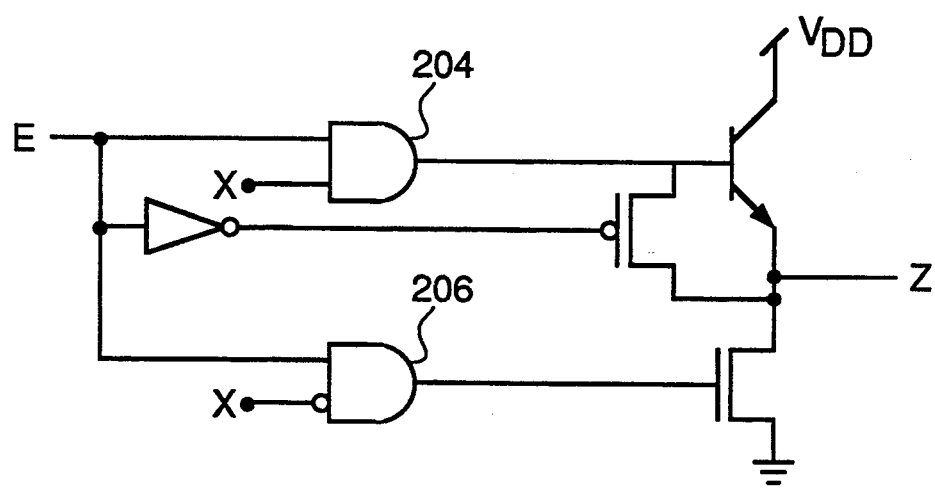

FIG. 12 is a tri-state device, formed using only a single cell, which has an output which can be driven high, low, or to a high impedance state. A high impedance state is achieved by applying a low signal to the base of the bipolar pull-up transistor and to the gate of the large N-channel pull-down transistor. AND gates 204 and 206 are formed using equivalent logic.

Figure 13:
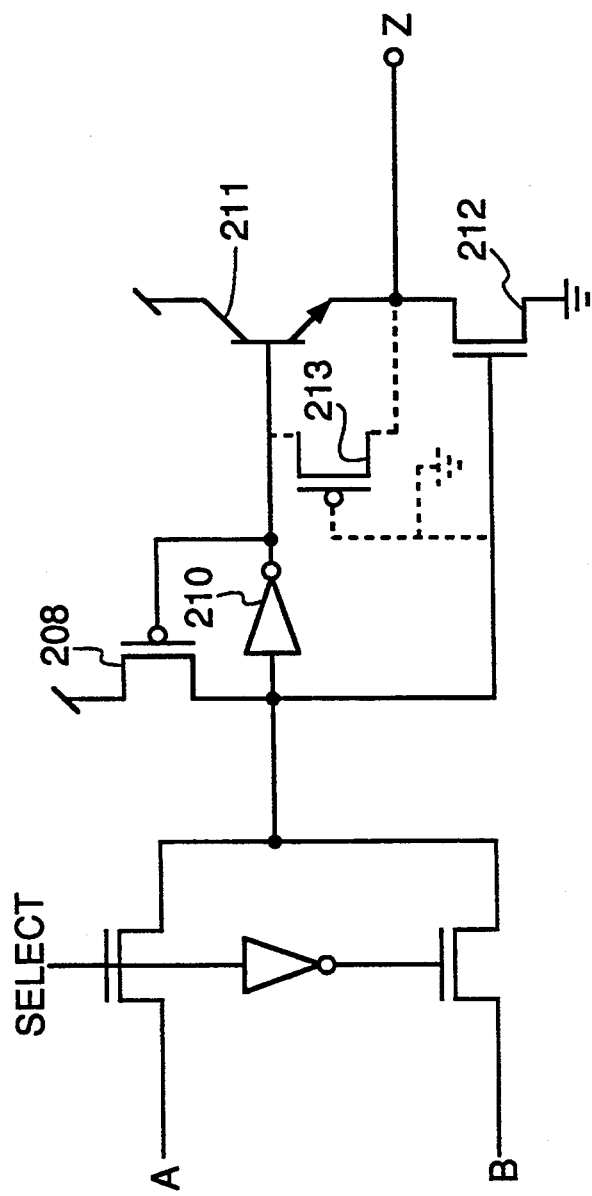
Figure 14:
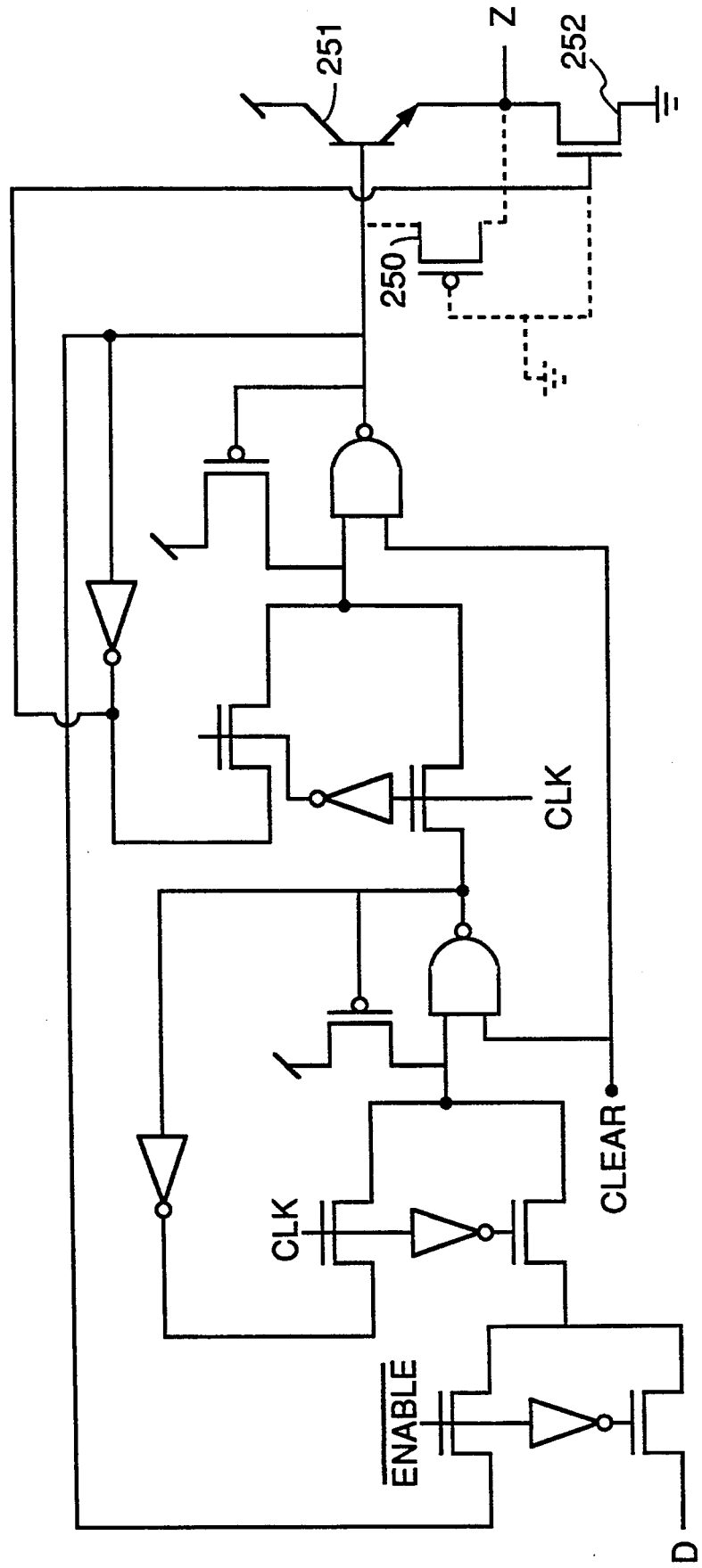

FIG. 13 shows a 2:1 mux with an inverted output using a single cell where small P-channel transistor 208 is used to pull up the input of the inverter 210 to the power supply voltage when the output of the inverter 210 is a logical zero. Thus, the voltage applied to the gate of N-channel transistor 212 is the full power supply voltage, and the voltage applied to the base bipolar transistor 211 is ground potential, when the output of inverter 210 is a logical zero. Hence, small P-channel transistor 208 acts to increase the noise margin of the circuit of FIG. 13 by providing static power to the input of inverter 210.

Optional small P-channel transistor 213 eliminates the $V_{BE}$ drop across bipolar transistor 211 when output z is high. The gate of transistor 213 may be connected to ground potential or to the gate of transistor 212.

The mux of FIG. 13 may be formed using a single compute section and the drive section of the cell.

FIG. 14 is a D-flip-flop having clear, enable, and clock (Clk) control input terminals, which requires two cells to create. All the N-channel transistors shown, except the pull-down driver transistor, are small size transistors, while the inverters comprise medium size P and N-channel transistors. Optional small P-channel transistor 250 eliminates the $V_{BE}$ across transistor 251 when output z is high. The gate of transistor 250 may be connected to ground potential or to the gate of transistor 252.

As seen, the macrocells shown in FIGS. 3–6 and 9–14 all use a drive section comprising bipolar transistor 58 and one or more large N-channel transistors, such as transistor 62, shown in FIG. 1. The SRAMs of FIGS. 7 and 8 do not require a drive circuit, since their outputs are determined by a differential sense amplifier. As a result, the CMOS components within the compute sections of the cells may be made much smaller than the prior art CMOS components, since the components within the present cell are not intended by themselves to provide sufficient current to drive a typical next stage. Thus, die area is conserved in compute sections 22 and 24, while die area is also conserved in drive section 26, since an N-channel pull-down transistor is used instead of an NPN bipolar pull-down transistor and the concomitant buffer MOSFETs. Using this BiNMOS cell, no MOSFETs are required to buffer a base of a bipolar pull-down transistor to avoid a high current path through the pull-down bipolar transistor to ground.

Additionally, the components within the compute sections of the cell of FIG. 1 enable the implementation of any two-input logic gate with true and complement outputs. The logic circuits of FIGS. 3, 5, and 9, minus the driver circuit, are but a few of the logic gates possible. Further, the P-channel transistor Q1 is FIG. 5, which uses either P-channel transistor 48 or 34 in FIG. 1, is used as required to ensure full true and complement levels.

The particular combination of components within each compute section provides numerous advantages. If the driver portion of the cell of FIG. 1 were eliminated and the transistors made larger to drive larger loads, the resulting cell would still be very advantageous.

Figure 15:
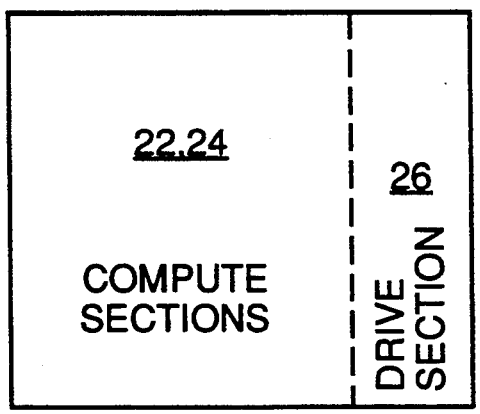
FIG. 15 shows the preferred tiling of the cell of FIGS. 1 and 2 in a mask programmable sea of gates structure.
Figure 15:
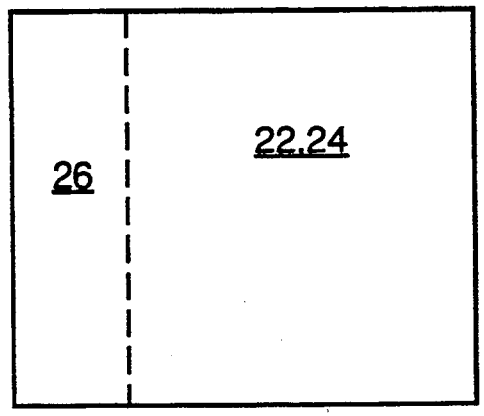
Figure 15:
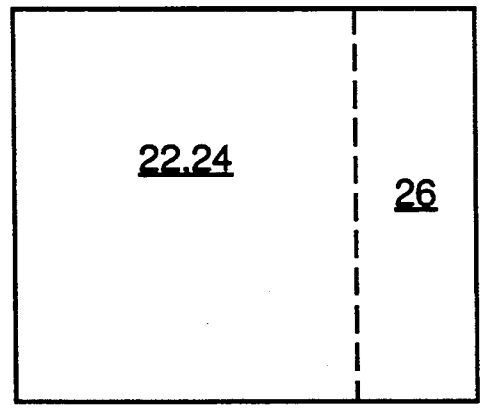
Figure 15:
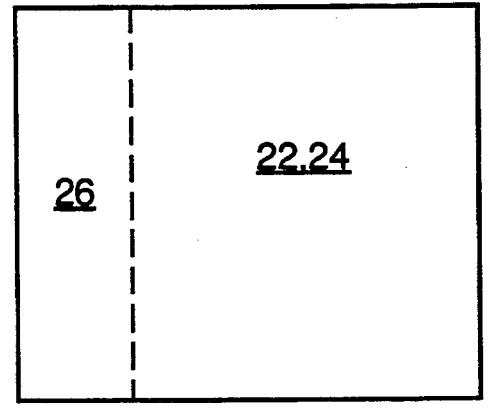

FIG. 15 illustrates the preferred tiling of the cell structure shown in FIGS. 1 and 2, wherein the cells are arranged in a mirror image type configuration so that two, three, or four drive sections may be coupled together to provide a very high capacitance drive for large fanout requirements. Additionally, using the tiling of FIG. 15, compute sections within a plurality of cells may be pooled to create more complex macrocells.

Additional compute sections as well as drive sections may be added in each cell in alternative embodiments of the invention. Thus, there may be more than one bipolar pull-up transistor in a single cell, albeit only one bipolar transistor per drive section. Further, in an array of cells, some cells may have a different number of compute sections than others.

As seen, the single cell structure of FIGS. 1 and 2 may be used to form a wide variety of macrocells, a few examples of which are given in FIGS. 3–13. Two or more cells may be used to form more complex macrocells, one example of which is shown in FIG. 14. In addition to the advantages of providing virtually each cell with a novel drive section, which requires no MOSFETs within the compute section of the cell to buffer the base of a bipolar pull-down transistor and thus incurs no penalty for its use, and the reduction the required size of the CMOS components within the compute section of the cell, the selection of the particular components comprising the cell shown in FIGS. 1 and 2 provide extraordinary advantages. For example, the two SRAM memory cells shown in FIG. 7 are created using a single cell of 1300 square microns. No prior art cell of which Applicant is aware can create two SRAM memory cells within a 1300 square micron area in a sea of gates type gate array. In contrast, the article, "A 120K.-Gate Usable CMOS Sea of Gates Packing 1.3M Transistors," by Suehiro et al., published in IEEE 1988 Custom Integrated Circuits Conference, boasts of an improved CMOS sea of gates for creating higher density SRAMs. Although the basic cell size stated in the article is 1042 square microns, each cell can only implement a single SRAM. Thus, Applicant's novel cell not only includes an improved drive section but can implement almost twice as many SRAM memory cells per die area as the sea of gates device described in the above-named article.

By increasing the number of compute sections in each cell, an increased SRAM memory cell density can be achieved, since the percentage of die area devoted to the unused driver sections is diminished. However, the drivers still remain available for use in other macrocells.

Numerous other examples of improved die area efficiency for virtually every macrocell formed using Applicant's cell of FIGS. 1 and 2 can similarly be shown.

Figure 16:
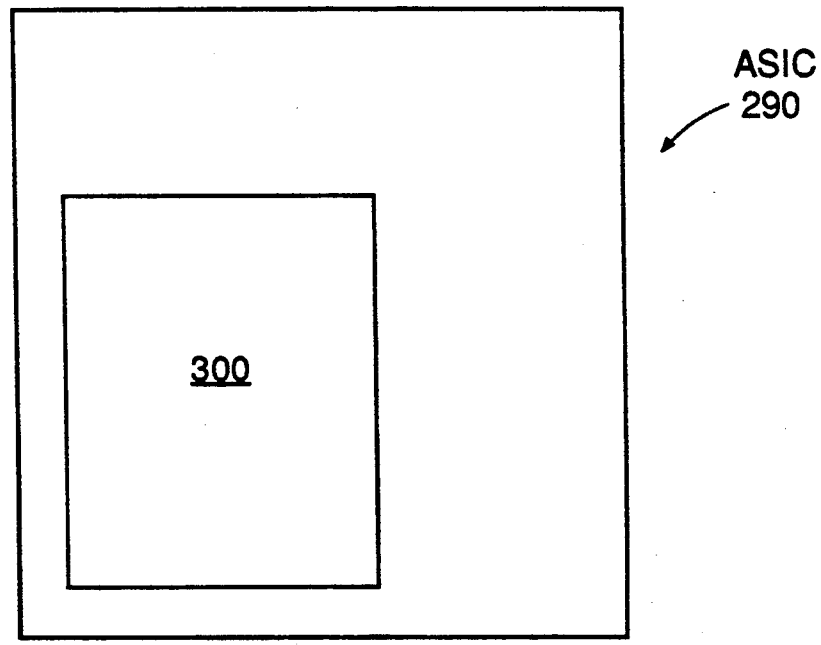
FIG. 16 shows an ASIC having an array section comprising a plurality of the cell of FIGS. 1 and 2.

FIG. 16 shows an ASIC 290 which contains array 300 comprised of BiNMOS cells, such as the cell of FIGS. 1 and 2, which may or may not be metallized. In this ASIC, the area of the chip outside of array 300 may contain other circuitry connected to interact with array 300. ASIC 290 may also contain plurality of arrays 300.

While particular embodiments of the present invention have been shown and described, it will be obvious to those skilled in the art that changes and modifications may be made without departing from this invention in its broader aspects and, therefore, the appended claims are to encompass within their scope also changes and modifications as forward in the true spirit and scope of this invention.

I claim:

1. A cell for use in a mask programmable array comprising:

one or more small size P-channel transistors;
two or more medium size P-channel transistors;
two or more small size N-channel transistors;
two or more medium size N-channel transistors; and
one or more large size N-channel transistors;
said medium size P-channel transistors having a channel width at least approximately twice the size of said small size P-channel transistors, said medium size N-channel transistors having a channel width at least approximately twice the size of said small size N-channel transistors, said channel width of said small size P-channel transistors being equal to or narrower than said channel width of said small size N-channel transistors, said large size N-channel transistors having a channel width larger than the channel width of said medium size N-channel transistors, gates of said one or more small size N-channel transistors being isolated from gates of said one or more small and medium size P-channel transistors, wherein said cell is one of a plurality of identical cells located within an interior of said mask programmable array.

2. In a programmed BiCMOS gate array containing a plurality of programmed BiCMOS cells, each of said BiCMOS cells comprising:

a plurality of P-channel transistors;

two or more sizes of N-channel transistors; and one or more NPN bipolar transistors, each of said one or more NPN bipolar transistors sharing an N-well with one or more of said P-channel transistors so that said NPN bipolar transistors may only be used as pull-up devices, said BiCMOS cells containing no PNP bipolar transistors, said BiCMOS cells being formed internal to said gate array.

3. The BiCMOS cells of claim 2 wherein said one or more NPN bipolar transistors comprise only one NPN bipolar transistor.

4. The BiCMOS cells of claim 2 wherein certain ones of said N-channel transistors are located within said cell so as to allow an adjacent identical BiCMOS cell in an array of BiCMOS cells to share said certain ones of said N-channel transistors.

5. The BiCMOS cells of claim 4 wherein said certain ones of said N-channel transistors are for use as additional pull-down devices in a macrocell formed formed by the interconnection of components in said adjacent identical cell, said pull-down devices for driving an output of said macrocell to a low state.

6. In a programmed BiCMOS gate array containing a plurality of programmed BiCMOS cells, each of said BiCMOS cells comprising:

a plurality of P-channel transistors;

a plurality of N-channel transistors; and one more more bipolar transistors, each of said one or more bipolar transistors sharing an N-well with one or more of said P-channel transistors as that said bipolar transistors may only be used as pull-up devices, wherein said plurality of P-channel transistors comprises two or more sizes of P-channel transistors, where a size corresponds to a channel width, wherein said plurality of N-channel transistors comprise three or more sizes of N-channel transistors, where a size corresponds to a channel width, and wherein said cells are internal to said gate array.

7. The BiCMOS cells of claim 6 wherein said P-channel transistors comprise at least one medium size P-channel transistor and at least one small size P-channel transistor, wherein said small size P-channel transistor is smaller than said medium size P-channel transistor; and said N-channel transistors comprise at least one small size N-channel transistor, at least one medium size N-channel transistor, and at lest one large size N-channel transistor, wherein said small size N-channel transistor has a greater current handling capability than said at least one medium size P-channel transistor, wherein said medium size N-channel transistor is larger than said small size N-channel transistor, and wherein said large size N-channel transistor is larger than said medium size N-channel transistor.

8. The BiCMOS cells of claim 7 wherein said one or more bipolar transistors comprise only one bipolar transistor.

9. An integrated circuit containing an array of programmed BiCMOS cells, one or more said cells comprising one or more substantially rectangular compute sections and one or more drive sections, each drive section comprising one or more bipolar transistors for use as pull-up devices in one or more macrocells, and one or more N-channel transistors for use as pull-down devices in said one or more macrocells for driving an output of said one or more macrocells to a low state, each compute section comprising components which may be interconnected to form a two-to-one multiplexer, said multiplexer having true and complement outputs, said true output being equal to a power supply voltage, said complement output being equal to ground potential.

10. The BiCMOS cells of claim 9 wherein each of said compute sections contains components which may be interconnected to form a D latch having a D input terminal, a clock input terminal, and an inverted clock input terminal, such that when a clock signal applied to said clock input terminal is high, an output of said latch corresponds to a D input signal applied to said D input terminal of said latch, and when said clock signal is low, said output of said latch is unchanged.

11. The BiCMOS cells of claim 9 wherein two of said compute sections contains components which may be interconnected to form a dual port SRAM cell, each port being independently useable to read or write contents of said SRAM cell.

12. The BiCMOS cells of claim 9 wherein two of said compute sections contain components which may be interconnected to form a master/slave D flip-flop having a D input terminal, a clock input terminal, and an inverted clock input terminal.

13. The BiCMOS cells of claim 9 wherein two of said compute sections contain components which may be interconnected to form any two-input logic gate with true and complement outputs, said true output being equal to a power supply voltage, said complement output being equal to ground potential.

14. The BiCMOS cells of claim 9 wherein two of said compute sections contain components which may be interconnected to form two SRAM memory cells.

15. The BiCMOS cells of claim 9 wherein each of said drive sections further comprises one or more P-channel transistors.

16. The BiCMOS cells of claim 9 wherein said compute sections within said cell are identical to one another.

17. The BiCMOS cells of claim 9 wherein said N-channel transistors for use as pull-down devices are located within said cell so as to allow an adjacent identical BiCMOS cell in an array of BiCMOS cells to share said N-channel transistors.

18. The BiCMOS cells of claim 17 wherein said N-channel transistors are for use as additional pull-down devices in a macrocell formed by the interconnection of components in said adjacent identical cell, said pull-down devices for driving an output of said macrocell to a low state.

19. In a programmed gate array containing a plurality of programmed cells, each of said cells comprising;

one or more substantially rectangular compute sections and one or more drive sections, each of said drive sections containing one or more MOS transistors which are substantially larger than MOS transistors within said compute sections, each compute section comprising:

two or more sizes of P-channel transistors, where a size corresponds to a channel width; and two or more sizes of N-channel transistors;

wherein said P-channel transistors comprise at least two medium size P-channel transistors and at least one small size P-channel transistors, wherein said small size P-channel transistor is smaller than each of said medium size P-channel transistor; and said N-channel transistors comprise at least two small size N-channel transistors and at least two medium size N-channel transistors, wherein each of said small size N-channel transistors has a greater current handling capability than each of said at least two medium size P-channel transistors, and wherein each of said medium size N-channel transistors is larger than each of said small size N-channel transistors.

20. The cells of claim 19 wherein each of said at least two medium size N-channel transistors is at least approximately twice as large as each of said at least two small size N-channel transistors.

21. The cells of claim 20 wherein each of said compute sections comprises:

two of said medium size P-channel transistors;
one or more of said small size P-channel transistors;
two of said medium size N-channel transistors; and
two of said small size N-channel transistors.

22. The cells of claim 19 wherein each of said drive sections comprise one or more bipolar transistors for use as pull-up device sin macrocells for driving an output of said macrocells to a high state and one or more N-channel divides for use as pull-down divides in macrocells for driving an output of said macrocells to a low state.

23. The cells of claim 22 wherein each drive section further comprises one or more P-channel transistors.

24. The cells of claim 19 wherein certain ones of said MOS transistors within said drive sections are located so as to allow an adjacent identical cell in an array of cells to share said certain ones of said MOS transistors.

25. The cells of claim 24 wherein said certain ones of said MOS transistors are for use as additional pull-down devices in a macrocell formed by the interconnection of components in said adjacent identical cell, said pull-down devices for driving an output of said macrocell to a low state.

26. The cells of claim 19 wherein each of said one or more drive sections comprises a first transistor for providing pull-up drive current in a single programmed cell and a second transistor for providing pull-down drive current in said single programmed cell.

27. The cells of claim 26 wherein said first transistor is a bipolar transistor.

28. The cells of claim 27 wherein said second transistor is an N-channel MOS transistor.

29. In a programmed BiCMOS gate array, one or more macrocells having one or more bipolar transistors being used as pull-up devices and no bipolar transistors being used as pull-down devices, wherein said pull-up devices are for driving an output of said one or more macrocells to a high state, wherein said one or more macrocells are formed by the interconnection of components within one or more BICMOS cells in an unprogrammed BiCMOS gate array, each of said BiCMOS cells comprising one or more compute sections and one or more drive sections, each of said one or more drive sections including said one or more bipolar transistors, and each of said compute sections comprising a plurality of P-channel transistors, a plural of N-channel transistors, and no bipolar transistors.

30. The programmed BiCMOS gate array of claim 29 wherein said plurality of P-channel transistors comprise P-channel transistors of two or more different channel widths, and wherein said plurality of N-channel transistors comprise N-channel transistors of two or more different channel widths.

31. In a programmed BiCMOS gate array, one or more macrocells having one or more bipolar transistors being used as pull-up devices and no bipolar transistors being used as pull-down devices, wherein said pull-up devices are for driving an output of said one or more macrocells to a high state, wherein said one or more macrocells are formed by the interconnection of components within one or more BiCMOS cells in an unprogrammed BiCMOS gate array, each of said BiCMOS cells comprising one or more substantially rectangular compute sections and one or more drive sections, each of said drive sections comprising:

one or more bipolar transistors for use as pull-up devices in said one or more macrocells for driving an output of said one or more macrocells to a high state, and one or more N-channel transistors for use as pull-down devices in said one or more macrocells for driving an output of said one or more macrocells to a low state.

32. The programmed BiCMOS gate array of claim 31 wherein two drive sections are adjacent to one another to allow components within adjacent drive sections to be interconnected to increase current drive capabilities for a single macrocell.

33. The programmed BiCMOS state array of claim 31 wherein at least one of said one or more N-channel transistors in each of said drive sections has a greater current handling capability than any N-channel transistors within said compute sections.

34. The programmed BiCMOS gate array of claim 31 wherein two or more compute sections are directly adjacent to each other, with one of said two or more compute sections adjacent to a single drive section so that components within said two or more compute sections and components within said single drive section may be interconnected to form a single macrocell.

35. An integrated circuit containing an array of unprogrammed BiCMOS cells, one or more of said cells comprising one or more substantially rectangular compute sections and one or more drive sections, each drive section comprising three or more drive transistors for use as drive transistors in a single macrocell, said three or more drive transistors being programmably connectable so as to provide said macrocell with a variety of pull-up or pull-down driving capabilities.

36. The integrated circuit of claim 35 wherein said three or more transistors comprise a plurality of transistors for use as pull-up transistors in a single macrocell and one or more transistors for use as pull-down transistors in said single macrocell, said plurality of pull-up transistors being programmably connectable so as to provide said macrocell with a variety of output driving capabilities.

37. The integrated circuit of claim 36 wherein said plurality of transistors for use as pull-up transistors comprises a plurality of bipolar transistors.

38. The integrated circuit of claim 35 wherein said three or more transistors comprise one or more transistors for use as pull-up transistors in a single macrocell and a plurality of transistors for use as pull-down transistors in said single macrocell, said plurality of pull-down transistors being programmably connectable so as to provide said macrocell with a variety of output driving capabilities.

39. The integrated circuit of claim 38 wherein said plurality of transistors for use as pull-down transistors comprises a plurality of N-channel transistors.

40. The integrated circuit of claim 35 wherein said three or more transistors comprise a plurality of transistors for use as pull-up transistors in a single macrocell and a plurality of transistors for use as pull-down transistors in said single macrocell, said plurality of pull-up and pull-down transistors being programmably connectable so as to provide said macrocell with a variety of output driving capabilities.

41. The integrated circuit of claim 40 wherein said pull-up transistors comprise a plurality of bipolar transistors.

42. The integrated circuit of claim 40 wherein said pull-down transistors comprise a plurality of N-channel transistors.

* * * * *